(12) United States Patent
Jo et al.

(10) Patent No.: US 11,323,084 B2
(45) Date of Patent: May 3, 2022

(54) LINEAR AMPLIFIER

(71) Applicant: Nippon Telegraph and Telephone Corporation, Tokyo (JP)

(72) Inventors: Teruo Jo, Tokyo (JP); Shinsuke Nakano, Tokyo (JP); Munehiko Nagatani, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 17/284,240

(22) PCT Filed: Oct. 16, 2019

(86) PCT No.: PCT/JP2019/040628
§ 371 (c)(1),
(2) Date: Apr. 9, 2021

(87) PCT Pub. No.: WO2020/090466
PCT Pub. Date: May 7, 2020

(65) Prior Publication Data
US 2021/0359655 A1 Nov. 18, 2021

(30) Foreign Application Priority Data

Oct. 30, 2018 (JP) .............................. JP2018-203543

(51) Int. Cl.
*H03F 3/45* (2006.01)
*H03F 1/02* (2006.01)
*H03G 3/30* (2006.01)

(52) U.S. Cl.
CPC ....... *H03F 3/45188* (2013.01); *H03F 1/0233* (2013.01); *H03F 3/45183* (2013.01); *H03F 3/45475* (2013.01); *H03F 2200/324* (2013.01); *H03F 2200/78* (2013.01); *H03G 3/30* (2013.01)

(58) Field of Classification Search
CPC ............... H03F 3/45188; H03F 1/0233; H03F 2200/324; H03F 2200/78; H03F 1/34; H03F 3/45183; H03F 3/45179; H03F 3/45192; H03F 3/45089; H03F 3/45659; H03F 3/45475; H03F 3/45071; H03F 3/45479; H03F 1/302; H03F 1/30; H03G 3/30
USPC .......................... 330/253, 255, 258, 259, 290
See application file for complete search history.

(56) References Cited

PUBLICATIONS

M. Nagatani, et al., "A 3-Vppd 730-mW Linear Driver IC Using InP HBTs for Advanced Optical Modulations," IEEE Compound Semiconductor Integrated Circuit Symposium, Oct. 13-16, 2013, 6 pages.

*Primary Examiner* — Khanh V Nguyen
(74) *Attorney, Agent, or Firm* — Slater Matsil, LLP

(57) ABSTRACT

A linear amplifier includes a pre-amplifier configured to amplify an input differential signal, a post-amplifier configured to amplify an output signal of the pre-amplifier, an amplitude detector configured to detect an amplitude of an output signal of the post-amplifier, and an output voltage corresponding to the detected amplitude, a comparator configured to control a tail current source of the pre-amplifier such that when the output voltage of the amplitude detector is less than or equal to a reference voltage, a tail current of the pre-amplifier is set to a constant value, and when the output voltage of the amplitude detector is larger than the reference voltage, the tail current is reduced to make the output voltage of the amplitude detector equal to the reference voltage.

17 Claims, 10 Drawing Sheets

LINEAR AMPLIFIER

This patent application is a national phase filing under section 371 of PCT/JP2019/040628, filed Oct. 16, 2019, which claims the priority of Japanese patent application no. 2018-203543, filed Oct. 30, 2018, each of which is incorporated herein by reference in its entirety.

TECHNICAL FIELD

The present disclosure relates to a circuit configuration of a linear amplifier for linearly amplifying and outputting electrical signals, and in particular, relates to a linear amplifier capable of maintaining high linearity up to a large output signal strength close to a limit of withstand voltage of the amplifier.

BACKGROUND

A modulator driver circuit used, for example, in a transmitter for optical communication is used to drive an optical modulator in the optical transmitter and serves to amplify the amplitude strength of a transmitted electrical signal to a level at which the optical modulator can be driven. In general, it is desirable that the output signal of the modulator driver circuit have a large signal strength, a wide frequency band, and a high linearity to increase the signal-to-noise ratio (S/N ratio), the symbol rate, and the degree of multi-value of an optical signal.

A circuit example of a modulator driver in the related art is illustrated in FIG. 14(A), and an example of the output amplitude in response to the input amplitude of the modulator driver is illustrated in FIG. 14(B). As illustrated in FIG. 14(A), the modulator driver includes a post-amplifier 100.

In such a modulator driver, the linearity is typically high in a region where the output amplitude is small, and the nonlinearity becomes sharply stronger as the signal output approaches the limit output. Consequently, to obtain an output signal having high linearity, a region in which a signal output is lower than the limit output is used. For example, an example has been reported in which a modulator driver is operated in an output amplitude region with its output being approximately 70% of the limit output to maintain high linearity (see Non Patent Literature 1).

As described above, circuits the limit output of which can be as large as about 1.4 times ($\approx$100/70) are required, to ensure the required linear signal strength. To enable a circuit capable of large signal output, a transistor with high withstand voltage is required, but typically, the withstand voltage performance and the maximum operating frequency performance of the transistor have a trade-off relationship. Thus, there is a problem in that it is difficult to enable a circuit that can achieve a large signal strength, a wide frequency band, and a high linearity.

CITATION LIST

Non Patent Literature

Non Patent Literature 1: M. Nagatani et al., "A3-Vppd 730-mW Linear Driver IC Using InP HBT for Advanced Optical Modulations", 2013 IEEE Compound Semiconductor Integrated Circuit Symposium.

SUMMARY

Technical Problem

Embodiments of the present disclosure have been made to solve the above problems, and an embodiment of the present disclosure provides a linear amplifier allowing a large signal strength, a wide frequency band, and a high linearity without the need of transistors with high withstand voltage.

Means for Solving the Problem

A linear amplifier of embodiments of the present disclosure includes: a pre-amplifier configured to amplify an input electrical signal; a post-amplifier configured to amplify an output signal of the pre-amplifier; an amplitude detector configured to detect an amplitude of an output signal of the post-amplifier and output a voltage corresponding to the detected amplitude; and a comparator configured to control a tail current source of the pre-amplifier such that when the output voltage of the amplitude detector is less than or equal to a reference voltage, a tail current of the pre-amplifier is set to a constant value, and when the output voltage of the amplitude detector is larger than the reference voltage, the tail current is reduced to make the output voltage of the amplitude detector equal to the reference voltage.

Further, in one configuration example of the linear amplifier of embodiments of the present disclosure, the tail current source of the pre-amplifier includes: a first transistor which is emitter grounded or source grounded, a collector terminal or a drain terminal of the first transistor being connected to an amplification transistor of the pre-amplifier; and a second transistor a gate terminal of which is connected to an output terminal of the comparator, a constant bias voltage being input to one of a drain terminal and a source terminal of the second transistor, another of the drain terminal and the source terminal of the second transistor being connected to a base terminal or a gate terminal of the first transistor.

Further, in one configuration example of the linear amplifier of embodiments of the present disclosure, the tail current source of the pre-amplifier includes: a first transistor, a constant bias voltage being input to a base terminal or a gate terminal of the first transistor, a collector terminal or a drain terminal of the first transistor being connected to an amplification transistor of the pre-amplifier; and a second transistor a gate terminal of which is connected to an output terminal of the comparator, one of a drain terminal and a source terminal of the second transistor being connected to an emitter terminal or a source terminal of the first transistor, another of the drain terminal and the source terminal of the second transistor being grounded.

Further, in one configuration example of the linear amplifier of embodiments of the present disclosure, the comparator includes an operational amplifier including an inverting input terminal to which the output voltage of the amplitude detector is input, and a non-inverting input terminal to which the reference voltage is input.

Further, in one configuration example of the linear amplifier of embodiments of the present disclosure, the comparator includes: an operational amplifier including a non-inverting input terminal to which the reference voltage is input; a resistor including one end connected to an output terminal of the amplitude detector, and another end connected to an inverting input terminal of the operational amplifier; and a capacitor including one end connected to the inverting input terminal of the operational amplifier, and another end connected to an output terminal of the operational amplifier.

Further, in one configuration example of the linear amplifier of embodiments of the present disclosure, the post-amplifier is a cascode type differential amplifier.

Further, in one configuration example of the linear amplifier of embodiments of the present disclosure, the pre-amplifier includes at least: an amplification transistor having a differential configuration in which a differential signal is input to a base terminal or a gate terminal, and an amplified differential signal is output from a collector terminal or a drain terminal; two load resistors between a power supply voltage and the collector terminal or the drain terminal of the amplification transistor having the differential configuration; and the tail current source configured to supply a current to the amplification transistor having the differential configuration.

One configuration example of the linear amplifier of embodiments of the present disclosure further includes an automatic offset voltage control circuit configured to draw a current from the load resistor of the pre-amplifier such that a DC voltage operating point of an output of the pre-amplifier is constant.

Effects of Embodiments of the Invention

According to embodiments of the present disclosure, the linear amplifier includes an amplitude detector and a comparator, which eliminates the need to use a transistor having a large withstand voltage considering up to the limit output in the linear amplifier. Thus, it is possible to achieve a large signal strength, a wide frequency band, and a high linearity.

DETAILED DESCRIPTION OF ILLUSTRATIVE EMBODIMENTS

First Embodiment

Figure 1:
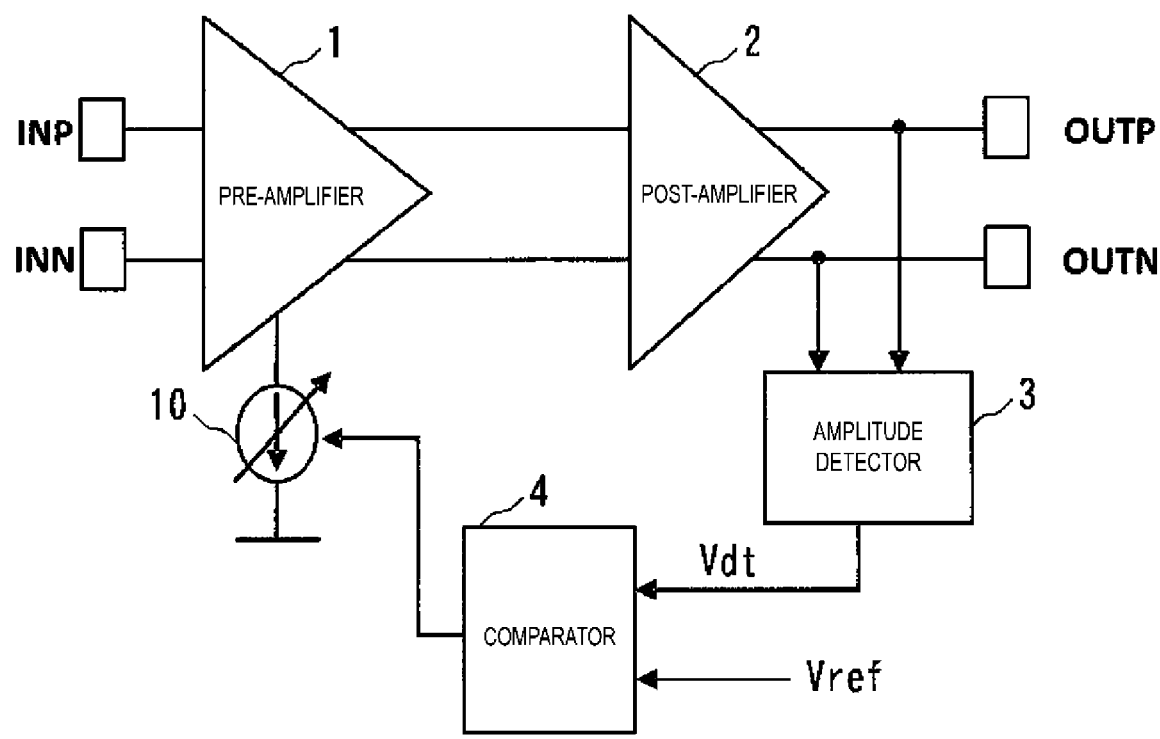
FIG. 1 is a block diagram illustrating a configuration example of a linear amplifier according to a first embodiment of the present disclosure.

Hereinafter, embodiments of the present disclosure will be described with reference to the drawings. FIG. 1 is a block diagram illustrating a configuration example of a linear amplifier according to a first embodiment of the present disclosure. The linear amplifier includes a pre-amplifier 1, a post-amplifier 2, an amplitude detector 3, and a comparator 4. Here, the pre-amplifier 1 amplifies an electrical signal (differential signal) for driving an optical modulator (not illustrated). The post-amplifier 2 amplifies the output signal of the pre-amplifier 1. The amplitude detector 3 detects the amplitude of the output signal of the post-amplifier 2, and outputs a voltage corresponding to the detected amplitude. Further, the comparator 4 controls a tail current source 10 of the pre-amplifier 1 such that when the output voltage of the amplitude detector 3 is equal to or less than a reference voltage, the tail current of the pre-amplifier 1 is set to a constant value, and when the output voltage of the amplitude detector 3 is greater than the reference voltage, the tail current is reduced so that the output voltage of the amplitude detector 3 becomes equal to the reference voltage.

In the present embodiment, the amplitude detector 3 detects the output amplitude of the post-amplifier 2. The comparator 4 compares a detection voltage Vdt output from the amplitude detector 3 with a reference voltage Vref and controls the tail current source 10 as follows. That is, the control is performed such that a current flowing in the pre-amplifier 1 is reduced to satisfy Vdt≈Vref, that is, the detection voltage Vdt is substantially equal to the reference voltage Vref, when Vdt>Vref is satisfied, that is, when the detection voltage Vdt is greater than the reference voltage Vref.

Figure 2:
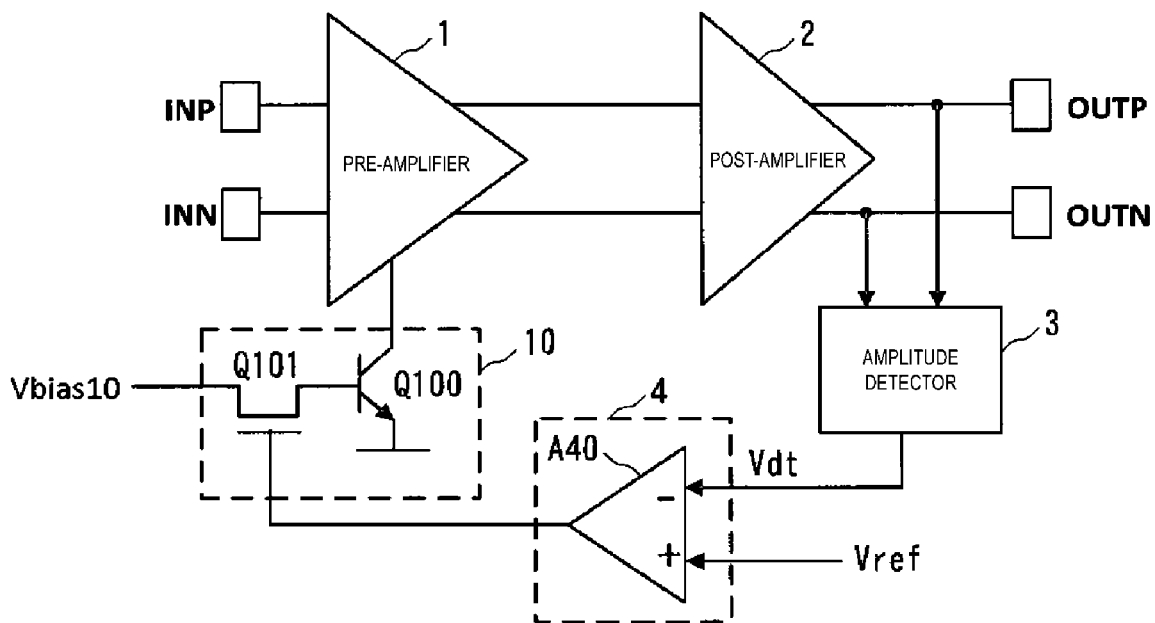
FIG. 2 is a diagram illustrating a configuration example of a comparator and a tail current source of the linear amplifier according to the first embodiment of the present disclosure.
Figure 3:
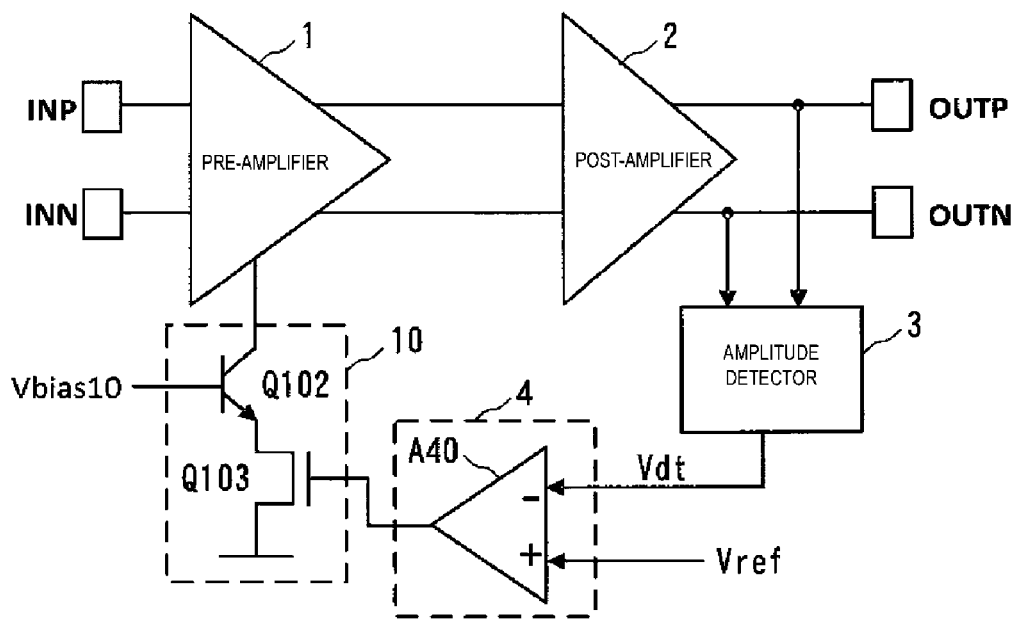
FIG. 3 is a diagram illustrating another configuration example of the comparator and the tail current source of the linear amplifier according to the first embodiment of the present disclosure.

Specific configuration examples of the comparator 4 and the tail current source 10 are illustrated in FIGS. 2 and 3. In the example of FIGS. 2 and 3, an operational amplifier A40 is used as the comparator 4. Further, in the example of FIG. 2, the tail current source 10 includes a bipolar transistor (hereinafter, referred to as a transistor) Q100, and a field effect transistor (hereinafter, referred to as a FET) Q101. Here, the transistor Q100 includes a collector terminal connected to an amplification transistor (not illustrated) of the pre-amplifier 1, and an emitter terminal which is grounded. The FET Q101 includes a gate terminal connected to the output terminal of the comparator 4, a constant bias voltage Vbias10 is input to one of the drain terminal and the source terminal, and the other of the drain terminal and the source terminal is connected to the base terminal of the transistor Q100.

On the other hand, in the example of FIG. 3, the tail current source 10 includes a transistor Q102 and an FET Q103. Here, in the transistor Q102, a constant bias voltage Vbias10 is input to the base terminal, and the collector terminal is connected to an amplification transistor (not illustrated) of the pre-amplifier 1. Further, the FET Q103 includes a gate terminal connected to the output terminal of the comparator 4, one of the drain terminal and the source terminal is connected to the emitter terminal of the transistor Q102, and the other of the drain terminal and the source terminal is grounded.

The amplitude detector 3 may be an amplitude detector 3 of a type in which the output voltage Vdt increases as the output amplitude of the post-amplifier 2 increases. In the following case, High voltage (maximum output voltage) is constantly output from the comparator 4, and a state in which the resistance value between the drain and the source of each of the FETs Q101 and Q103 is small, and a current flowing in the pre-amplifier 1 is large is maintained. Here, the above-described case is a case in which the post-amplifier 2 outputs a differential signal having such an amplitude that makes the detection voltage Vdt of the amplitude detector 3 smaller than the reference voltage Vref.

On the other hand, when the amplitude of the differential signal input to the pre-amplifier 1 increases and the output voltage Vdt of the amplitude detector 3 exceeds the reference voltage Vref, the output voltage of the comparator 4 is reduced, and a current flowing through the pre-amplifier 1 decreases. As a result, the gain of the pre-amplifier 1 is reduced, and the output amplitude of the post-amplifier 2 is reduced. Here, when the gain of the operational amplifier A40 constituting the comparator 4 is sufficiently large, the output amplitude of the post-amplifier 2 is reduced until Vdt≈Vref is satisfied.

That is, in the linear amplifier of the present embodiment a High voltage continues to be output from the operational amplifier A40, a predetermined constant current continues to flow through the pre-amplifier 1, and the pre-amplifier 1 and the post-amplifier 2 function as amplifiers having a constant gain A in the following output amplitude range. Here, this output amplitude range is a range in which the output voltage Vdt of the amplitude detector 3 is equal to or less than the reference voltage Vref. In this case, Vin×A≈Vout is satisfied, where Vin is the input amplitude of the differential signal input to the pre-amplifier 1 and Vout is the output amplitude of the differential signal output from the post-amplifier 2.

Here, the output amplitude Vout when the output voltage Vdt from the amplitude detector 3 is substantially the same as the reference voltage Vref is defined as Vout_limit. When a differential signal satisfying Vin×A>Vout_limit is input to the pre-amplifier 1, the current flowing through the pre-amplifier 1 decreases, and the amplitude of the differential signal output from the post-amplifier 2 is maintained at approximately Vout_limit.

Figure 14:
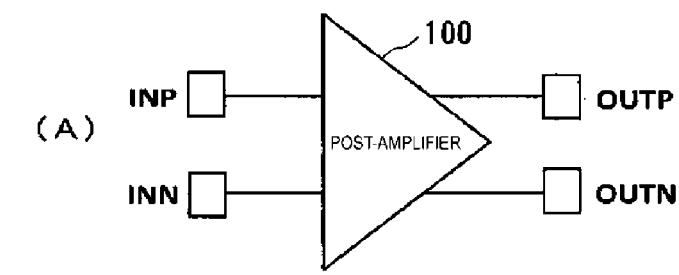
FIG. 14 is a diagram illustrating a circuit example of a modulator driver in the related art and a response example of an output amplitude to an input amplitude of the modulator driver.
Figure 14:
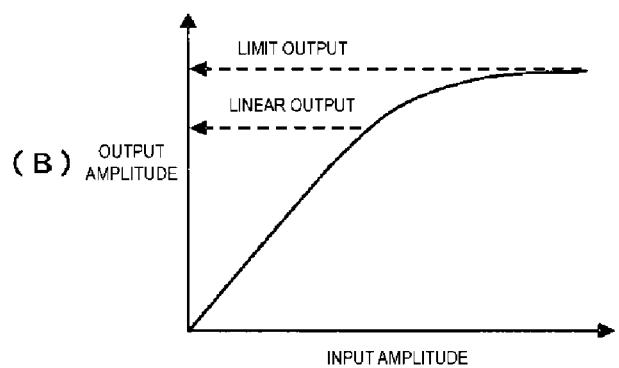

The value of the reference voltage Vref is set such that Vout_limit is about an output amplitude, the necessary linearity of which is maintained by the post-amplifier 2. Thus, in the linear amplifier of the present embodiment, it is not necessary to assume the operation up to the limit output illustrated in FIG. 14(B) in the post-amplifier 2. Consequently, in the present embodiment, each transistor of the post-amplifier 2 is designed to operate within a withstand voltage range when the output amplitude is Vout_limit or less. For example, a larger linear output strength than in the related art can be achieved under the condition that a circuit configuration, a transistor parameter and a material are the same in the post-amplifier 2.

Figure 4:
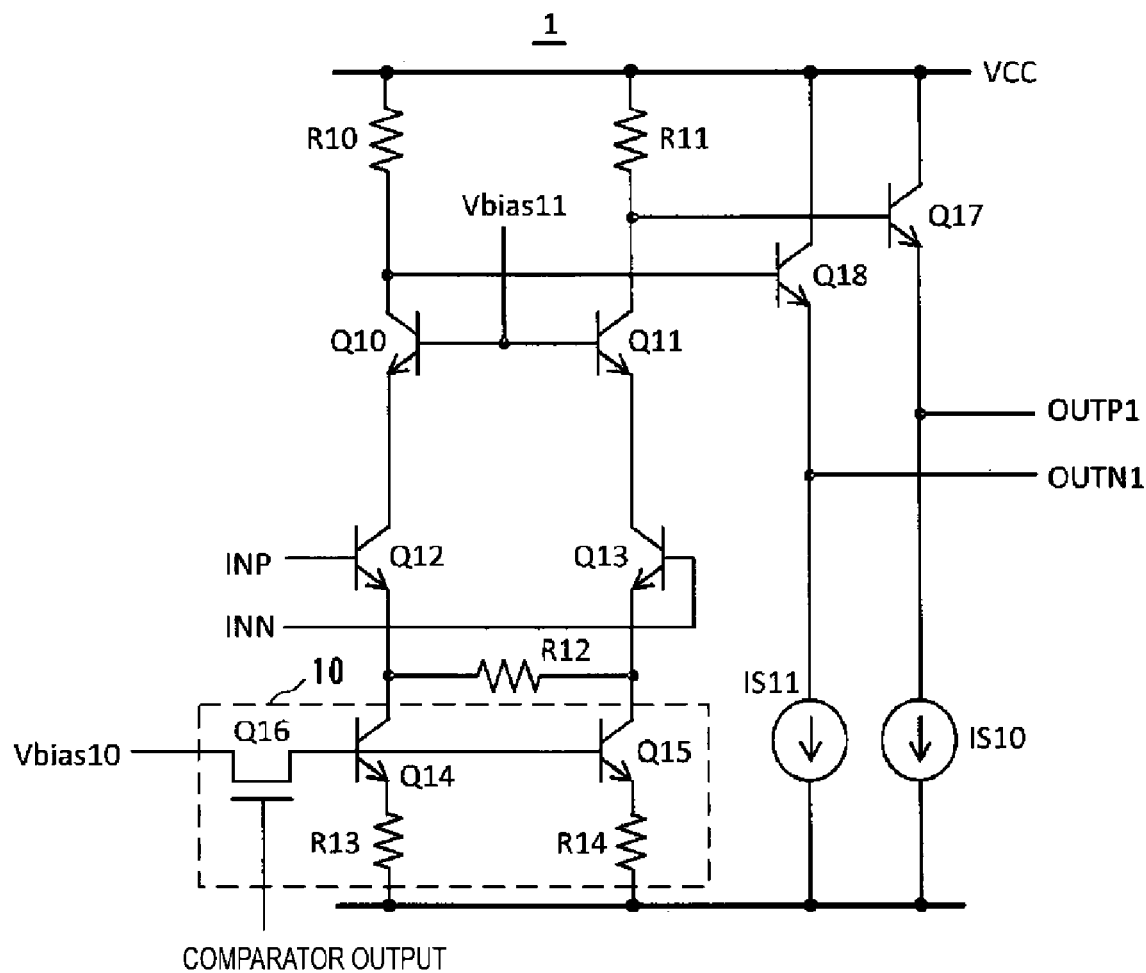
FIG. 4 is a circuit diagram illustrating a configuration example of a pre-amplifier of the linear amplifier according to the first embodiment of the present disclosure.
Figure 5:
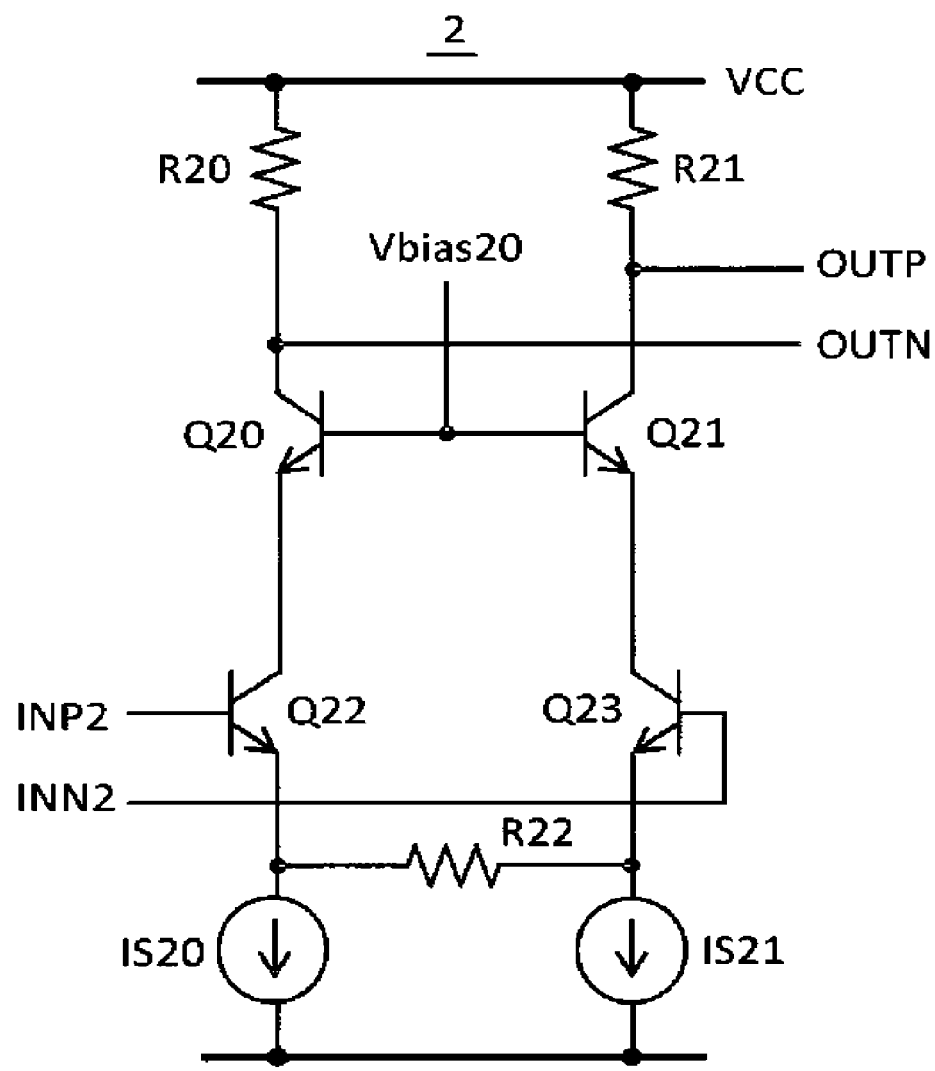
FIG. 5 is a circuit diagram illustrating a configuration example of a post-amplifier of the linear amplifier according to the first embodiment of the present disclosure.

FIG. 4 is a circuit diagram illustrating a configuration example of the pre-amplifier 1 of the present embodiment, and FIG. 5 is a circuit diagram illustrating a configuration example of the post-amplifier 2 of the present embodiment. The pre-amplifier 1 includes transistors Q10 and Q11, amplification transistors Q12 and Q13, transistors Q14 and Q15, an FET Q16, transistors Q17 and 18, resistors R10 and R11 (load resistors), resistors R12, R13, and R14, and current sources IS10 and IS11. Here, a constant bias voltage Vbias11 (Vbias11>Vbias10) is input to the base terminal of each of the transistors Q10 and Q11. The amplification transistors Q12 and Q13 include base terminals connected to the signal input terminals INP and INN of the linear amplifier (the signal input terminals of the pre-amplifier 1), and collector terminals connected to the emitter terminals of the transistors Q10 and Q11. Further, the transistors Q14 and Q15 include collector terminals connected to the emitter terminals of the transistors Q12 and Q13. The FET Q16 includes a gate terminal connected to the output terminal of the comparator 4, a drain terminal to which a constant bias voltage Vbias10 is input, and a source terminal connected to the base terminals of the transistors Q14 and Q15. The transistors Q17 and 18 include base terminals connected to the collector terminals of the transistors Q11 and Q10, and the emitter terminals connected to the signal output terminals OUTP1 and OUTN1 of the pre-amplifier 1.

Further, the resistors R10 and R11 each include one end connected to the power supply voltage Vcc, and the other end connected to the collector terminals of the transistors Q10 and Q11. Further, the resistor R12 includes one end connected to the emitter terminal of the transistor Q12 and the collector terminal of the transistor Q14, and the other end connected to the emitter terminal of the transistor Q13 and the collector terminal of the transistor Q15. Further, the resistors R13 and R14 each include one end connected to the emitter terminals of the transistors Q14 and Q15, and the other end is grounded. Further, the current sources IS10 and IS11 each include one end connected to the emitter terminals of the transistors Q17 and Q18, and the other end is grounded.

The transistors Q14 and Q15, the FET Q16 and the resistors R13 and R14 constitute the tail current source 10. The transistors Q14 and Q15 correspond to the transistor Q100 in FIG. 2, and the FET Q16 corresponds to the FET Q101 in FIG. 2.

Note that a bias voltage Vbias10 may be input to the base terminals of the transistors Q14 and Q15 with the FET Q16 removed, and the FET Q103 illustrated in FIG. 3 may be provided between the emitter terminals of the transistors Q14 and Q15 and the ground, instead of the resistors R13 and R14.

The post-amplifier 2 includes transistors Q20 and Q21, amplification transistors Q22 and Q23, resistors R20, R21, and R22, and current sources IS20 and IS21. Here, the transistors Q20 and Q21 include base terminals to which a constant bias voltage Vbias10 is input, and collector terminals connected to the signal output terminals OUTP and OUTN of the linear amplifier (the signal output terminals of the post-amplifier 2). Further, the amplification transistors Q22 and Q23 include base terminals connected to the signal input terminals INP2 and INN2 of the post-amplifier 2, and collector terminals connected to the emitter terminals of the transistors Q20 and Q21. Further, the resistors R20 and R21 each include one end connected to the power supply voltage Vcc, and the other end connected to the collector terminals of the transistors Q20 and Q21. Further, the resistor R22 includes one end connected to the emitter terminal of the transistor Q22 and the other end connected to the emitter terminal of the transistor Q23. Further, the current sources IS20 and IS21 each include one end connected to the emitter terminals of the transistors Q22 and Q23, and the other end is grounded.

The pre-amplifier 1 is a cascode type differential amplifier provided with the tail current source 10. Similarly, the post-amplifier 2 is a cascode type differential amplifier provided with tail current sources (current sources IS20 and IS21). The pre-amplifier 1 is provided with an emitter follower (transistors Q17 and Q18 and current sources IS10 and IS11) for dropping the DC operating point of the output signal down to a voltage range permissible by the signal input terminals INP2 and INN2 of the post-amplifier 2.

To perform signal amplification by each of the pre-amplifier 1 and the post-amplifier 2, respectively, the signal with the largest amplitude in the circuit is handled by the signal output terminals OUTP and OUTN of the post-amplifier 2. Thus, the withstand voltages of the transistors Q20 and Q21 connected to the terminals OUTP and OUTN constitute a limiting factor in outputting a large signal amplitude. In addition, in bipolar transistors for high speed operation, the withstand voltage between the collector and the emitter is typically less than the withstand voltage between the collector and the base or the withstand voltage between the emitter and the base.

To simply reduce the amplitude of the output signal, the current source controlled by the output of the comparator 4 may be used as the current source of the post-amplifier 2. However, when the current value of the current source of the post-amplifier 2 is reduced, the DC operating points of the signal output terminals OUTP and OUTN of the post-amplifier 2 increase, and the collector potentials of the transistors Q20 and Q21 increase. Each of the emitter terminal potentials of the transistors Q20 and Q21 is a potential that decreases from the potential applied to the base terminal by a threshold and an overdrive voltage. Thus, the emitter terminal potential is slightly increased due to the reduction in the current of the current source of the post-amplifier 2. However, in practice, the increase in collector potential is dominant, and thus the collector-emitter voltages of the transistors Q20 and Q21 vary to increase, that is, the voltages vary to exceed the withstand voltages of the transistors Q20 and Q21.

In the present embodiment, it is important to suppress the output amplitude while maintaining the DC operating points of the signal output terminals OUTP and OUTN of the post-amplifier 2 at a constant level, so that the tail current source 10 of the pre-amplifier 1 is controlled. Note that in the present embodiment, an example is described in which the tail current source 10 of the pre-amplifier 1 that is connected immediately before the post-amplifier 2 is controlled. However, when an amplifier is further provided in the preceding stage of the pre-amplifier 1, the current source of the preceding stage amplifier can be controlled by the output of the comparator 4.

In addition, there is a circuit mechanism that reduces the gain of the pre-amplifier in addition to controlling the current source, but in many cases, extra elements such as transistors are required to be connected to somewhere in the signal line in the pre-amplifier, and the parasitic capacitive components of such elements degrade the signal pass band of the entire amplifier.

As in the present embodiment, when the following method is used, an FET is added to the terminal that provides the DC bias potential or the GND potential instead of the wiring through which signals pass in any of the examples in FIGS. 2 to 4, so that the signal pass band of the entire linear amplifier does not degrade due to the parasitic capacitive component of the added FET. Here, the above-described method is a method for inserting FETs (Q16, Q101, and Q103) that act as variable resistors into the base terminals or emitter terminals of the transistors (Q14, Q15, Q100, and Q102) that constitute the tail current source 10 of the pre-amplifier 1.

In addition, the examples of the cascode type differential amplifier are illustrated in FIGS. 4 and 5, but in the present embodiment, the pre-amplifier 1 is only required to be provided with a tail current source controlled by the output of the comparator 4, and the present disclosure is not limited to the examples of FIGS. 4 and 5 and can also be applied to a circuit such as a normal differential amplifier.

Figure 6:
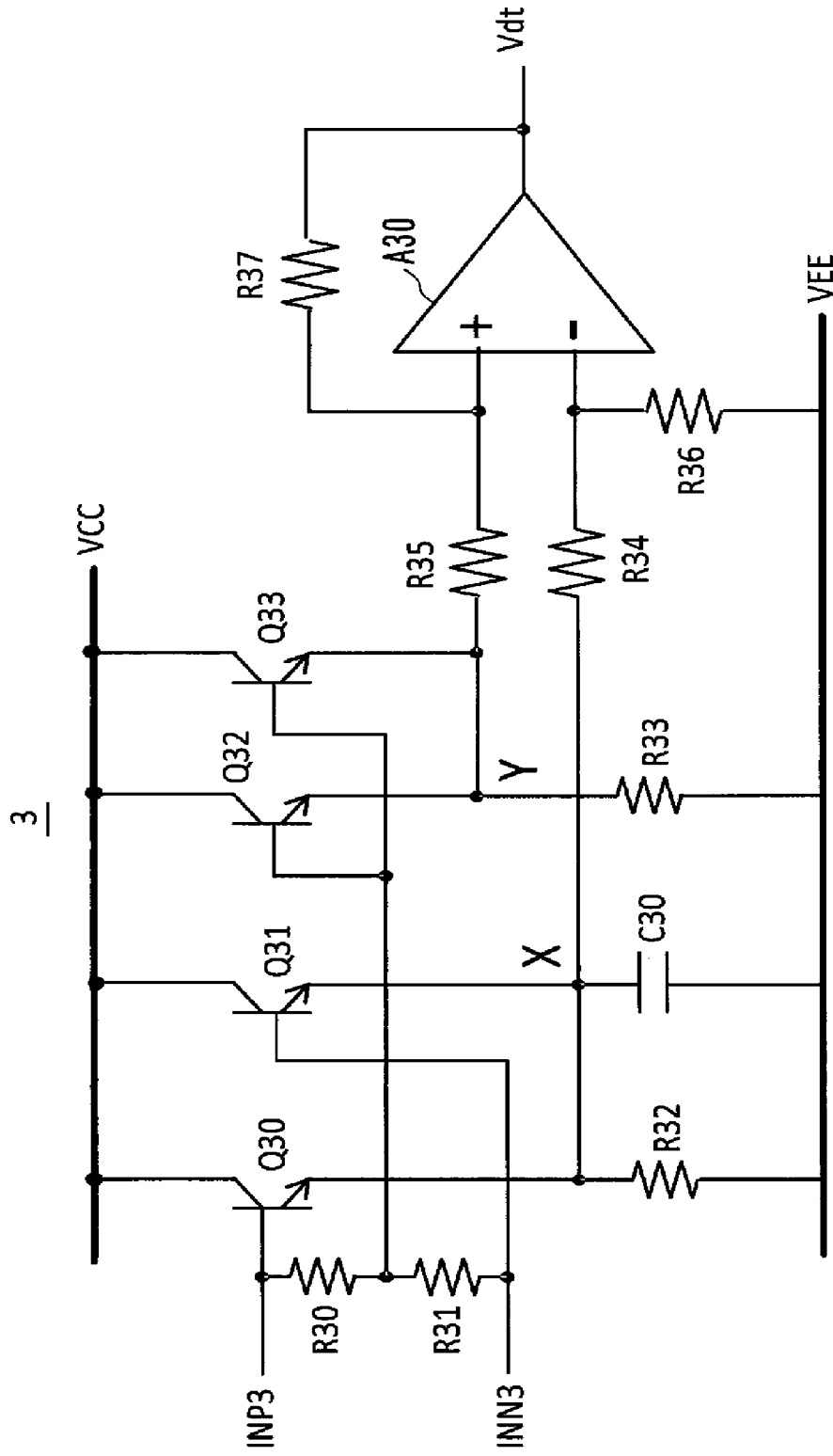
FIG. 6 is a circuit diagram illustrating a configuration example of an amplitude detector of the linear amplifier according to the first embodiment of the present disclosure.

FIG. 6 illustrates an example of the amplitude detector 3 that detects the amplitude of the differential signal. The amplitude detector 3 includes transistors Q30, Q31, Q32, and Q33, an operational amplifier A30, resistors R30, R31, R32, R33, R34, R35, R36, and R37, and a capacitor C30. Here, the transistors Q30 and Q31 include base terminals connected to the signal input terminals INP3 and INN3 of the amplitude detector 3 (signal output terminals OUTP and OUTN of the linear amplifier), and collector terminals connected to the power supply voltage Vcc. The transistors Q32 and Q33 include collector terminals connected to the power supply voltage Vcc. Further, the resistor R30 includes one end connected to the signal input terminal INP3, and the other end connected to the base terminals of the transistors Q32 and Q33. Further, the resistor R31 includes one end connected to the signal input terminal INN3, and the other end connected to the base terminals of the transistors Q32 and Q33. Further, the resistor R32 includes one end connected to the emitter terminals of the transistors Q30 and Q31, and the other end connected to the power supply voltage VEE (ground voltage). Further, the resistor R33 includes one end connected to the emitter terminals of the transistors Q32 and Q33, and the other end connected to the power supply voltage VEE. Further, the resistor R34 includes one end connected to the emitter terminals of the transistors Q30 and Q31, and the other end connected to the inverting input terminal of the operational amplifier A30. Further, the resistor R35 includes one end connected to the emitter terminals of the transistors Q32 and Q33, and the other end connected to the non-inverting input terminal of the operational amplifier A30. Further, the resistor R36 includes one end connected to the inverting input terminal of the operational amplifier A30, and the other end connected to the power supply voltage VEE. The resistor R37 includes one end connected to the non-inverting input terminal of the operational amplifier A30, and the other end connected to the output terminal of the operational amplifier A30. Further, the capacitor C30 includes one end connected to the emitter terminals of the transistors Q30 and Q31, and the other end connected to the power supply voltage VEE.

In FIG. 6, all of the transistors Q30 to Q33 are set to have the same size, the resistors R30 and R31 are set to have the same resistance value, and the resistors R32 and R33 are set to have the same resistance value. A differential signal, which is input to the signal input terminals INP3 and INN3, is peak-held by the transistors Q30 and Q31, the resistor R32, and the capacitor C30, and the resultant signal is output to the X terminal, which is the connection point of the emitter terminals of the transistors Q30 and Q31.

On the other hand, the average voltage of the differential signals input to the signal input terminals INP3 and INN3 is detected by the resistors R30 and R31. Then, a signal in which the DC operating point of the average voltage is made to match that of the terminal X by the transistors Q32 and Q33 and the resistor R33 is output to the Y terminal which is the connection point of the emitter terminals of the transistors Q32 and Q33.

The output voltage Vdt of the amplitude detector 3 is a voltage obtained by causing a differential amplifier including an operational amplifier A30 and resistors R34 to R37 to amplify the difference signal between the terminal X and the terminal Y by a desired gain. In the circuit example illustrated in FIG. 6, the higher the differential amplitude of the signal input to the signal input terminals INP3 and INN3, the higher the output voltage Vdt that is output. When the differential amplitude of the signal input to the signal input terminals INP3 and INN3 is zero, the terminals X and Y are at the same potential, so that the low output voltage Vdt is output.

Consequently, it is possible to achieve an amplitude detector 3 of a type in which the output voltage Vdt increases as the amplitude Vout of the output signal of the post-amplifier 2, which is equal to the amplitude of the input signal of the amplitude detector 3, increases.

Note that the operation of the circuit example illustrated in FIG. 6 has been described in the present embodiment. However, as described above, an amplitude detector 3 is only required to be of a type in which the output voltage Vdt increases as the amplitude Vout of the output signal of the post-amplifier 2 increases, and thus the configuration of the amplitude detector 3 is not limited to the example illustrated in FIG. 6.

In addition, in the description of the present embodiment, an example has been described in which the current source and the transistors for differential amplification are all bipolar transistors, but it is clear that the same effects can be obtained with circuits using FETs.

Second Embodiment

Figure 7:
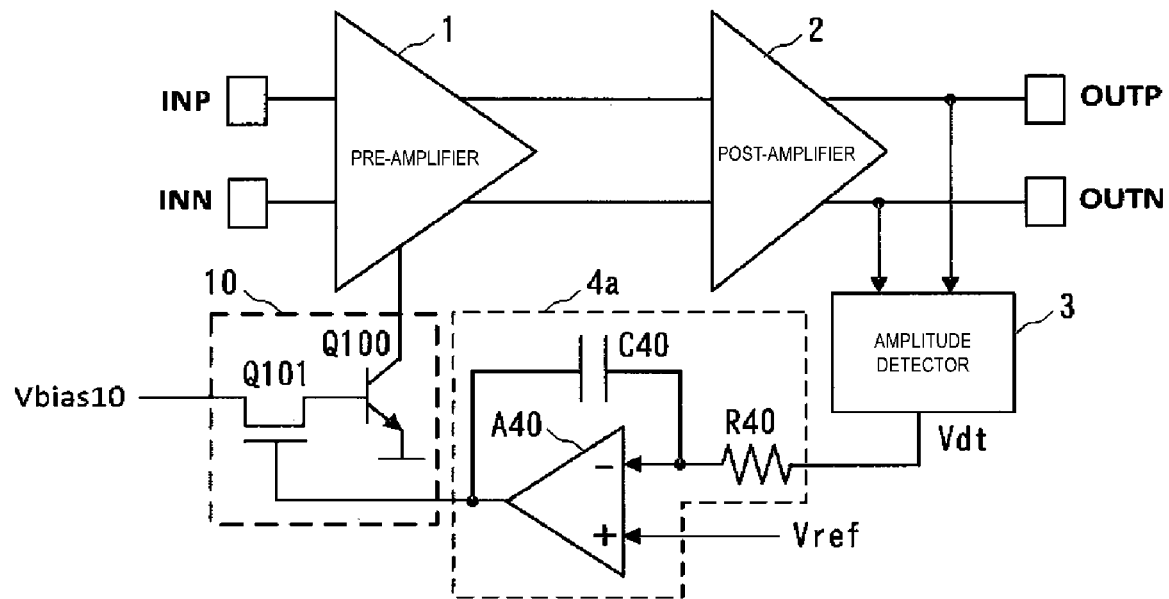
FIG. 7 is a block diagram illustrating a configuration example of a linear amplifier according to a second embodiment of the present disclosure.
Figure 8:
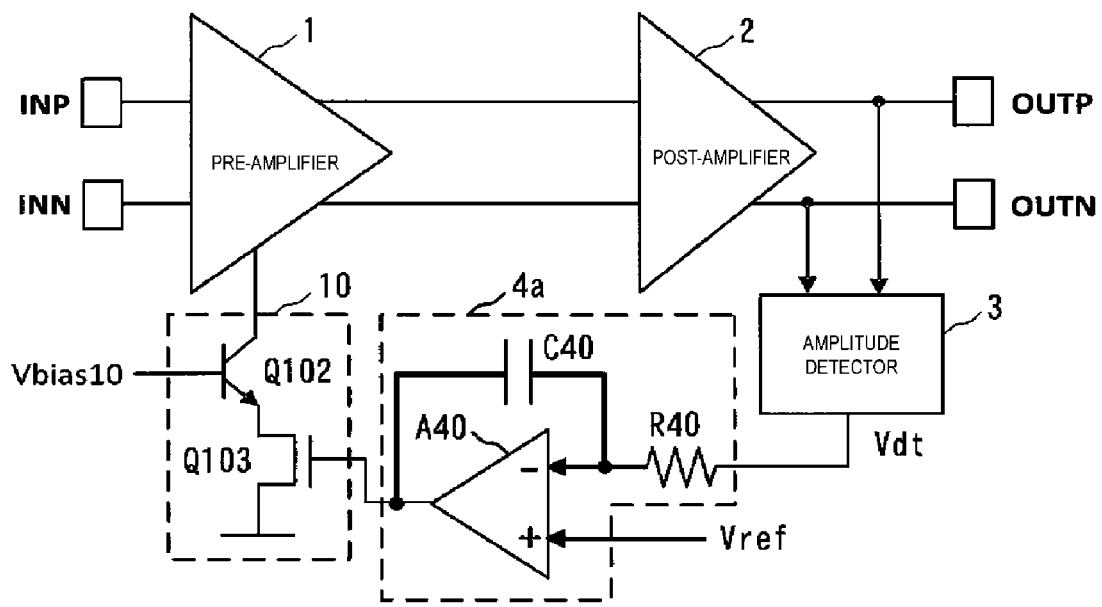
FIG. 8 is a block diagram illustrating a configuration example of the linear amplifier according to the second embodiment of the present disclosure.

Next, a second embodiment of the present disclosure will be described. FIG. 7 is a block diagram illustrating a configuration example of a linear amplifier according to the present embodiment. FIG. 8 is a block diagram illustrating another configuration example of the linear amplifier according to the present embodiment. The same components as those in FIGS. 1 to 3 are given the same reference signs.

The present embodiment is different from the first embodiment in that a resistor R40 is inserted in series between the output terminal of the amplitude detector 3 and the input terminal of the comparator 4a (the inverting input terminal of the operational amplifier A40), and the capacitor C40 is added between the inverting input terminal and the output terminal of the operational amplifier A40, so that the comparator 4a is constituted by a so-called integrator.

In embodiments of the present disclosure, a certain time delay occurs during the process of detecting the amplitude of the output signal of the post-amplifier 2 and the process in which the current value of the pre-amplifier 1 is changed, and then the amplitude of the output signal of the post-amplifier 2 is actually changed. In the following case, during the following period, the output of the comparator 4 continues to be decreased, and as a result, the current of the pre-amplifier 1 and the output amplitude Vout of the post-amplifier 2 are excessively reduced. Here, the above-described case is a case in which the response speed of the operational amplifier A40 constituting the comparator 4 of the first embodiment is faster than the total delay time described above. Additionally, the above-described period is a period from when the comparator 4 detects that the output voltage Vdt of the amplitude detector 3 exceeds the reference voltage Vref to when the output voltage Vdt of the amplitude detector 3 actually becomes lower than the reference voltage Vref.

Thereafter, the comparator 4 detects that the output voltage Vdt of the amplitude detector 3 is lower than the reference voltage Vref, and the output of the comparator 4 increases. However, during the following period, the output of the comparator 4 continues to increase, and thus the current of the pre-amplifier 1 and the output amplitude Vout of the post-amplifier 2 excessively increase. Here, the above-described period is a period from when the comparator 4 detects that the output voltage Vdt of the amplitude detector 3 is lower than the reference voltage Vref to when the output voltage Vdt of the amplitude detector 3 actually reaches the reference voltage Vref. Then, an excessive decrease and an excessive increase in the output amplitude Vout alternately occur, so that there is a risk that the operation of the linear amplifier falls into an unstable state. In such an unstable state, while the output amplitude Vout is excessively being increased, the transistors Q20 and Q21, and the like connected to the signal output terminals OUTP and OUTN of the post-amplifier 2 may exceed the withstand voltages, so that the effect of embodiments of the present disclosure may not be sufficiently achieved.

For this reason, in embodiments of the present disclosure, it is preferable that the response speed of the comparator be set to a lower speed than the delay time spent during the process of detecting the amplitude of the output signal of the post-amplifier 2 and the process in which the current value of the pre-amplifier 1 is changed and then the amplitude of the output signal of the post-amplifier 2 is actually changed.

The comparator 4a including the integrator in the present embodiment has characteristics of a low-pass filter including a resistor R40 and a capacitance value obtained by multiplying the capacitance value of the capacitor C40 by the gain of the operational amplifier A40 by a mirror effect of the operational amplifier A40. Thus, a small comparator which operates at a low speed can be achieved, allowing a linear amplifier to operate more stably.

Figure 9:
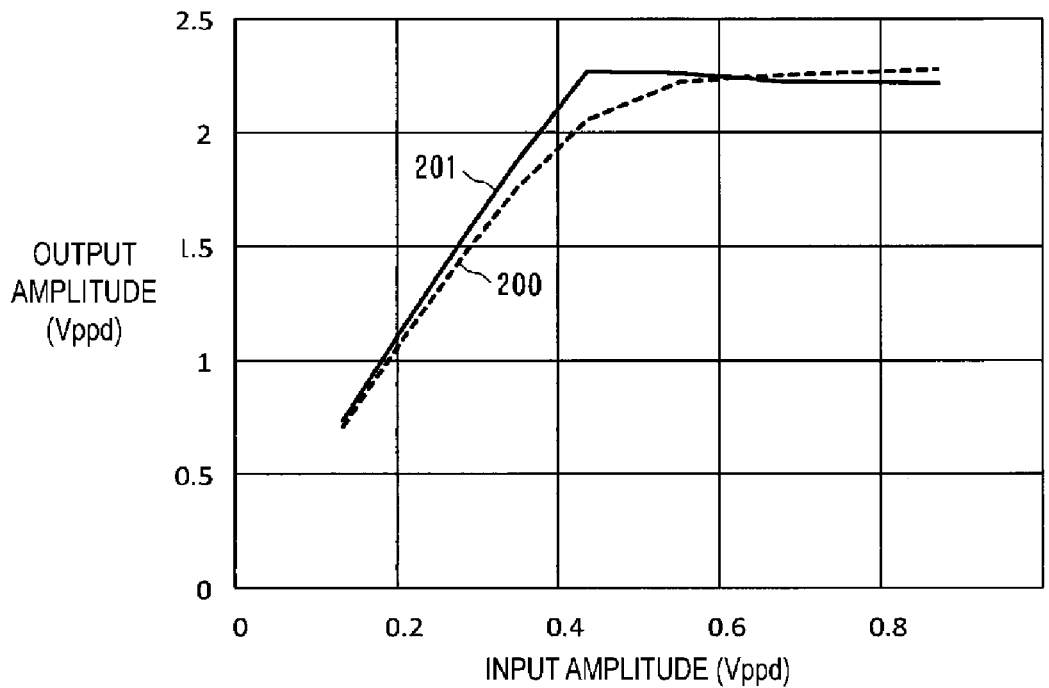
FIG. 9 is a diagram illustrating a result of calculating, by a circuit simulation, characteristics of an output amplitude with respect to an input amplitude of each of the linear amplifier according to the second embodiment of the present disclosure and a linear amplifier in the related art.
Figure 10:
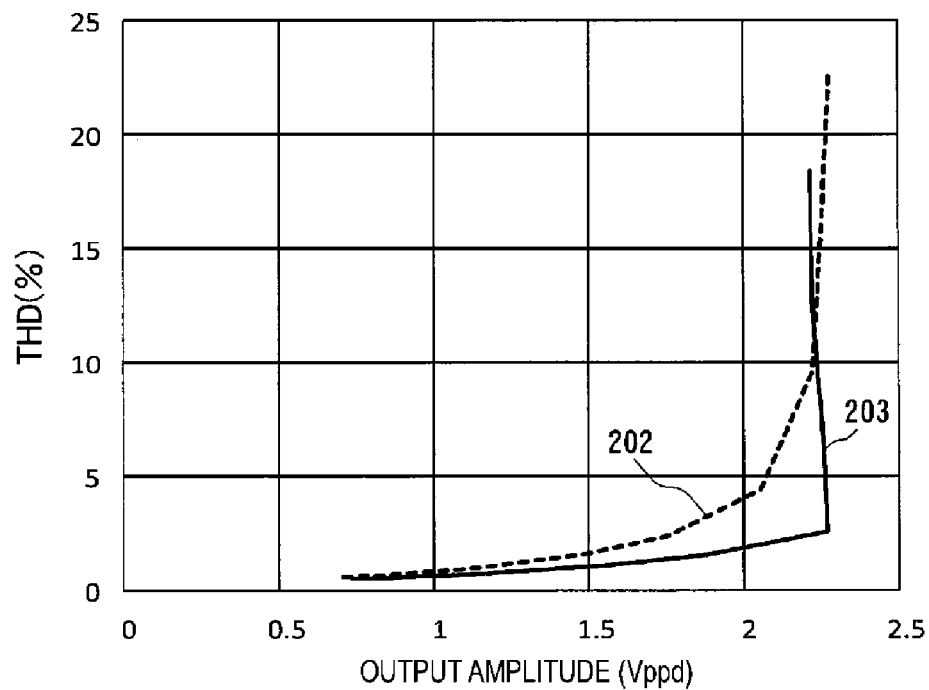
FIG. 10 is a diagram illustrating a result of calculating, by a circuit simulation, characteristics of a total harmonic distortion with respect to an output amplitude of each of the linear amplifier according to the second embodiment of the present disclosure and the linear amplifier in the related art.

FIG. 9 illustrates a result of calculating, by a circuit simulation, characteristics of the output amplitude Vout with respect to the input amplitude Vin of each of the linear amplifier according to the present embodiment illustrated in FIG. 7 and a linear amplifier in the related art. FIG. 10 illustrates a result of calculating, by a circuit simulation, characteristics of THD (total harmonic distortion) with respect to the output amplitude Vout. The reference sign 200 in FIG. 9 illustrates the characteristics of the output amplitude Vout with respect to the input amplitude Vin of the linear amplifier in the related art, and the reference sign 201 illustrates the characteristics of the output amplitude Vout with respect to the input amplitude Vin of the linear amplifier of the present embodiment. Further, the reference sign 202 in FIG. 10 illustrates the characteristics of the THD with respect to the output amplitude Vout of the linear amplifier in the related art, and the reference sign 203 illustrates the characteristics of the THD with respect to the output amplitude Vout of the linear amplifier of the present embodiment.

Here, the parameters of the SiGe BiCMOS process in the 90 nm generation are used as the parameters of each transistor constituting the pre-amplifier 1, the post-amplifier 2, the amplitude detector 3, and the comparator 4a. Further, a 1 GHz sinusoidal signal with a differential amplitude of 150 mVpp to 850 mVpp is used as a differential signal input to the signal input terminals INP and INN. The reference voltage Vref is also applied in a manner corresponding to the output voltage Vdt of the amplitude detector 3 when the output amplitude Vout of the post-amplifier 2 is 2.25 Vpp.

In the linear amplifier in the related art, the comparator 4*a* and the FET Q101 are removed from the configuration illustrated in FIG. 7, the bias voltage Vbias10 is directly applied to the base terminal of the transistor Q100 constituting the current source of the pre-amplifier 1, and the current value of the post-amplifier 2 is adjusted such that the limit output of the post-amplifier 2 becomes about 2.25 Vpp. Except that, the same circuit configuration and parameters as those proposed in the present embodiment are used.

It can be seen from FIG. 9 that the linear amplifier of the present embodiment linearly operates in a wider range (the output amplitude Vout is approximately proportional to the input amplitude Vin) than the linear amplifier in the related art, while maintaining the upper limit of the output amplitude Vout at the same level as the linear amplifier in the related art. For 1 GHz sinusoidal response, it can also be seen from FIG. 10 that the THD of the linear amplifier of the present embodiment is superior to that of the linear amplifier in the related art in a wider range. For example, when the output amplitude Vout is 2.2 Vpp, the THD of the linear amplifier in the related art is nearly equal to 9%, while the THD of the present embodiment is nearly equal to 2.3%. Thus, it can be understood that the linearity of the linear amplifier of the present embodiment is four times superior to that of the related art.

Third Embodiment

Figure 11:
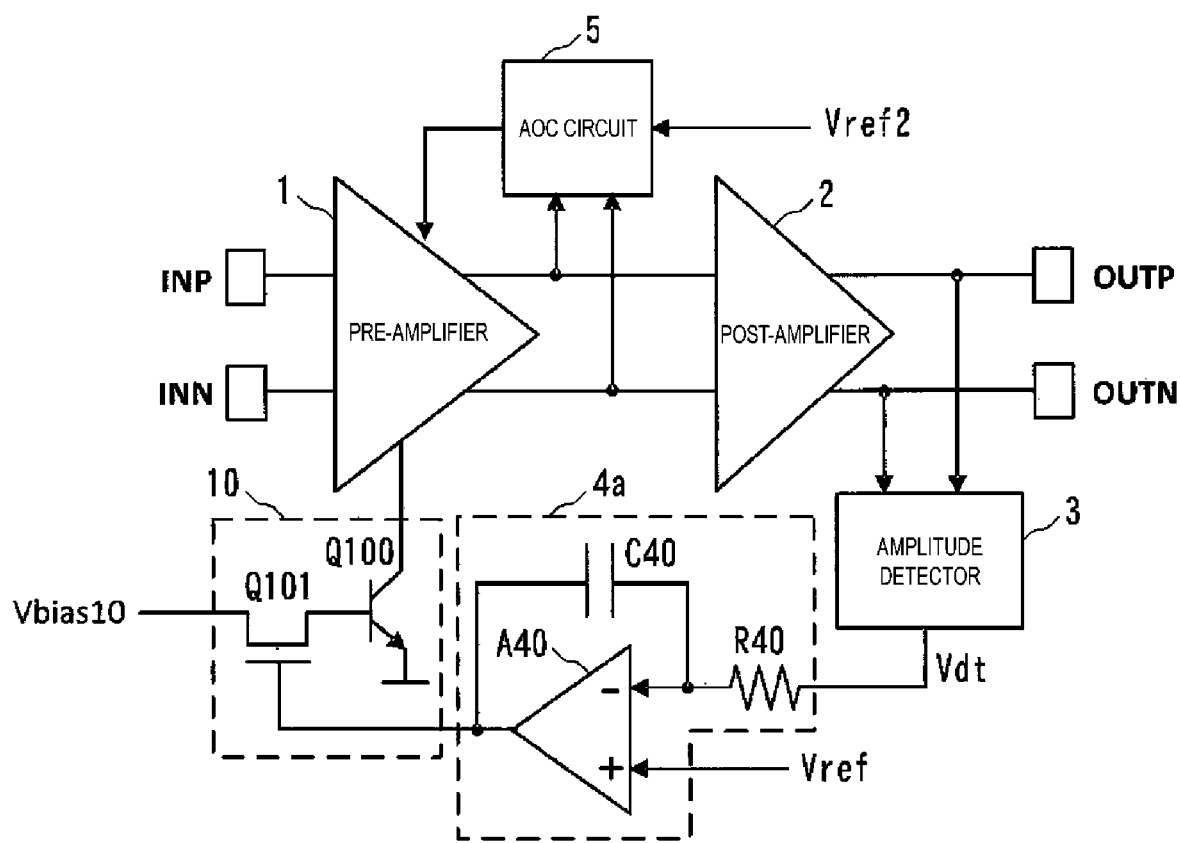
FIG. 11 is a block diagram illustrating a configuration example of a linear amplifier according to a third embodiment of the present disclosure.

Next, a third embodiment of the present disclosure will be described. FIG. 11 is a block diagram illustrating a configuration example of a linear amplifier according to the present embodiment. The same components as those in FIGS. 1 to 3, 7, and 8 are given the same reference signs.

The present embodiment is different from the first and second embodiments in including an automatic offset control (hereinafter referred to as "AOC") circuit 5 that draws a current from a load resistor of the pre-amplifier 1 such that the DC voltage operating point of the output of the pre-amplifier 1 is constant.

As described above, embodiments of the present disclosure propose a method for reducing the current of the pre-amplifier 1 to avoid increasing the output amplitude Vout of the post-amplifier 2 to a desired value or higher. When the pre-amplifier 1 includes a typical differential amplifier and the current value of the pre-amplifier 1 decreases, the DC voltage operating point of the output terminal changes. For example, in the case of the pre-amplifier 1 illustrated in FIG. 4, when the current value of the tail current source 10 is reduced, the DC voltage operating points of the signal output terminals OUTP1 and OUTN1 of the pre-amplifier 1 increase.

Assuming that the post-amplifier 2 illustrated in FIG. 5 is used, the base terminals of the transistors Q22 and Q23 may be broken in the following state. This state is a state in which the PN junction between the base and the collector enters an ON state in the transistors Q22 and Q23, and the DC operating points of the signal output terminals OUTP1 and OUTN1 of the pre-amplifier 1 (signal input terminals INP2 and INN2 of the post-amplifier 2) rises to the level at which the large current flows.

The linear amplifier of the present embodiment is provided with the AOC circuit 5 that suppresses the variance in the DC voltage operation of the output of the pre-amplifier 1, and thus the DC voltage operating point of the output of the pre-amplifier 1 can be maintained constant even in a case where the current of the pre-amplifier 1 is reduced. This reduces the possibility that the transistors Q22 and Q23 of the post-amplifier 2 are broken due to the increase in the DC voltage operating point.

Figure 12:
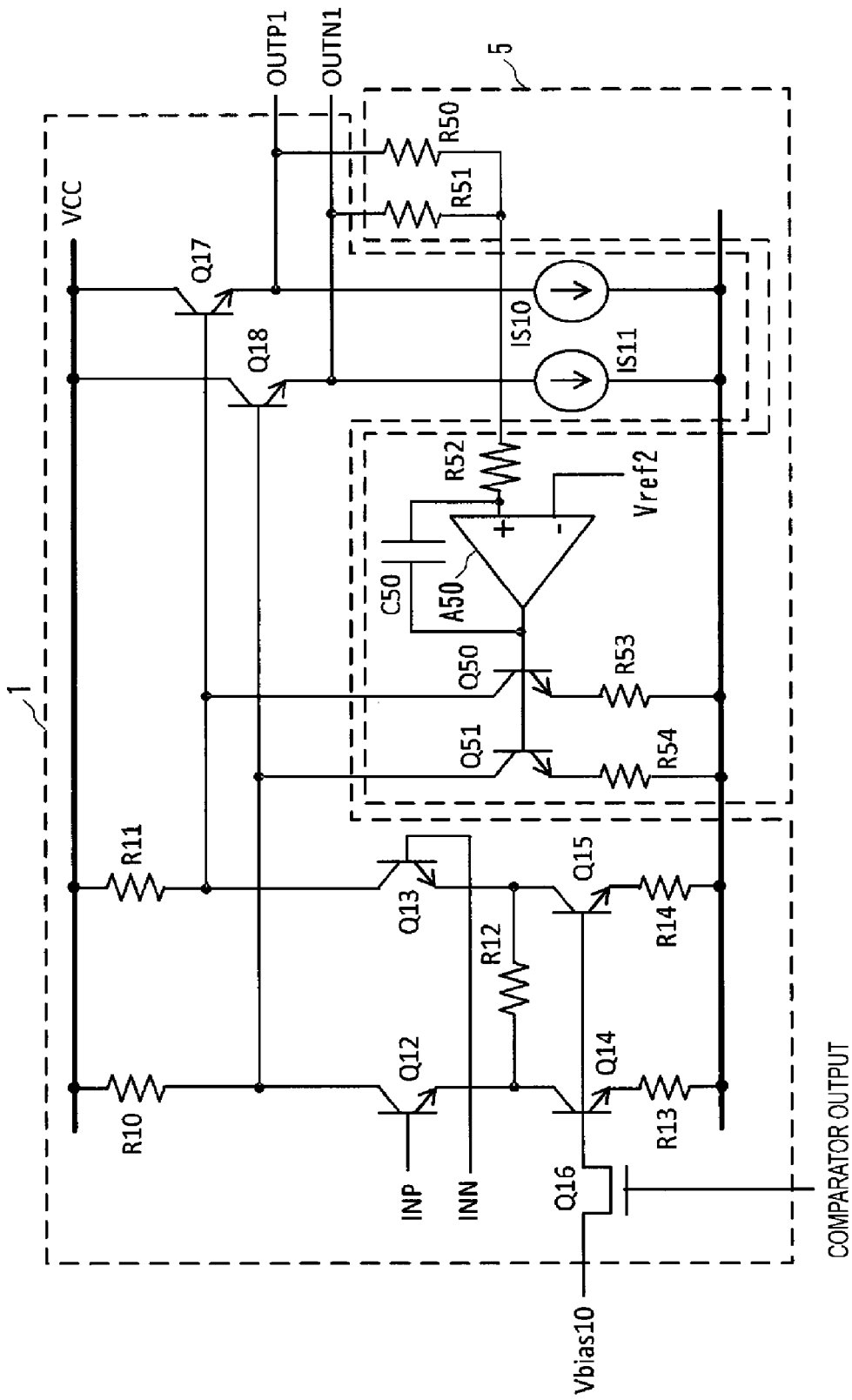
FIG. 12 is a circuit diagram illustrating a configuration example of a pre-amplifier and an AOC circuit of the linear amplifier according to the third embodiment of the present disclosure.

The circuit examples of the pre-amplifier 1 and the AOC circuit 5 of the present embodiment are illustrated in FIG. 12. The pre-amplifier 1 includes amplification transistors Q12 and Q13, transistors Q14, Q15, and FET Q16, transistors Q17 and Q18, resistors R10, Rn, R12, R13, and R14, and current sources IS10 and IS11. Here, the amplification transistors Q12 and Q13 include base terminals connected to the signal input terminals INP and INN of the linear amplifier (signal input terminal of the pre-amplifier 1). Further, the transistors Q14 and Q15 include collector terminals connected to the emitter terminals of the transistors Q12 and Q13. The FET Q16 includes a gate terminal connected to the output terminal of the comparator 4, a drain terminal to which a bias voltage Vbias10 is input, and a source terminal connected to the base terminals of the transistors Q14 and Q15. The transistors Q17 and Q18 include base terminals connected to the collector terminals of the transistors Q13 and Q12, and the emitter terminals connected to the signal output terminals OUTP1 and OUTN1 of the pre-amplifier 1. Further, the resistors R10 and Rn each include one end connected to the power supply voltage VCC, and the other end connected to the collector terminals of the transistors Q12 and Q13. Further, the resistor R12 includes one end connected to the emitter terminal of the transistor Q12 and the collector terminal of the transistor Q14, and the other end connected to the emitter terminal of the transistor Q13 and the collector terminal of the transistor Q15. Further, the resistors R13 and R14 each include one end connected to the emitter terminals of the transistors Q14 and Q15, and the other end is grounded. Further, the current sources IS10 and IS11 each include one end connected to the emitter terminals of the transistors Q17 and Q18, and the other end is grounded.

Note that in the example of FIG. 12, the transistors Q10 and Q11 illustrated in FIG. 4 are omitted, but the transistors Q10 and Q11 may be provided in the same manner as in FIG. 4. In the first and second embodiments, the pre-amplifiers 1 having the configuration illustrated in FIG. 12 may be used.

The AOC circuit 5 includes an operational amplifier A50, a transistor Q50, a transistor Q51, a resistor R50, a resistor R51, a resistor R52, and a capacitor C50. Here, the reference voltage Vref2 is input to the inverting input terminal of the operational amplifier A50. The transistor Q50 includes a base terminal connected to the output terminal of the operational amplifier A50, and a collector terminal connected to the collector terminal of the transistor Q13 and the base terminal of the transistor Q17. The transistor Q51 includes a base terminal connected to the output terminal of the operational amplifier Mo, and a collector terminal connected to the collector terminal of the transistor Q12 and the base terminal of the transistor Q18. Further, the resistor R50 includes one end connected to the signal output terminal OUTP1 of the pre-amplifier 1. Further, the resistor R51 includes one end connected to the signal output terminal OUTN1 of the pre-amplifier 1. The resistor R52 includes one end connected to the other end of each of the resistors R50 and R51, and the other end connected to the non-inverting input terminal of the operational amplifier Mo. The capacitor C50 includes one end connected to the non-inverting input terminal of the operational amplifier Mo, and the other end connected to the output terminal of the operational amplifier A50.

In the present embodiment, the reference voltage Vref2 and the common mode potential of the output of the pre-amplifier 1 extracted by the resistors R50 and R51 provided between the signal output terminals OUTP1 and OUTN1 of the pre-amplifier 1 are input to the operational amplifier A50, and the output of the operational amplifier A50 is connected to the base terminals of the transistors Q50 and Q51. With such a configuration, the value of the current flowing in the transistors Q50 and Q51 is controlled such that the common mode potential of the output of the pre-amplifier 1 and the reference voltage Vref2 become approximately equal to each other.

Thus, in the present embodiment, even when the current flowing in the differential amplifier constituting the pre-amplifier 1 increases or decreases, and the gain of the pre-amplifier 1 increases or decreases, the common mode potential of the signal output terminals OUTP1 and OUTN1 of the pre-amplifier 1 can be maintained constant.

Figure 13:
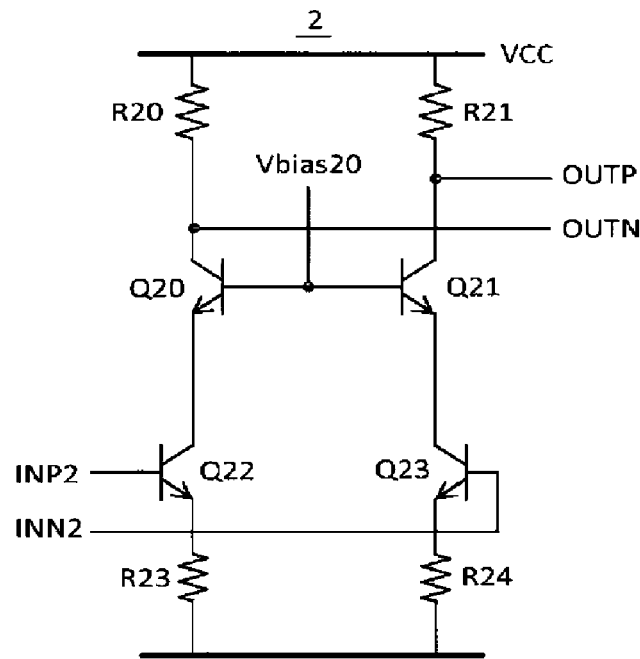
FIG. 13 is a circuit diagram illustrating another configuration example of a post-amplifier of the linear amplifier according to the third embodiment of the present disclosure.

Further, the DC operating points of the signal output terminals OUTP1 and OUTN1 of the pre-amplifier 1 can be maintained constant as in the present embodiment, so that a differential amplifier without a tail current source such as that illustrated in FIG. 13 may be used as the post-amplifier 2. The post-amplifier 2 illustrated in FIG. 13 is provided with resistors R23 and R24 in place of the current sources IS20 and IS21 in the circuit illustrated in FIG. 5.

According to the present embodiment, even when the current flowing in the differential amplifier constituting the pre-amplifier 1 increases or decreases, and the gain of the pre-amplifier 1 increases or decreases, the DC current flowing in the transistors Q22 and Q23 constituting the post-amplifier 2 can be maintained constant. In the configuration of FIG. 13, the tail current source is not required. Thus, the power supply voltage Vcc can be set to a low value more easily than in the configuration of the post-amplifier 2 illustrated in FIG. 5. As a result, there is also an advantage that the low power operation is easily achieved.

Note that in the present embodiment, the example has been described in which the AOC circuit 5 is applied in the second embodiment, but the AOC circuit 5 may be applied to the first embodiment.

Further, as described in the first embodiment, in the first to third embodiments, bipolar transistors may be replaced with FETs. In this case, the base terminals described in the first to third embodiments are replaced with the gate terminals, the emitter terminals are replaced with the source terminals, and the collector terminals are replaced with the drain terminals.

INDUSTRIAL APPLICABILITY

The present disclosure can be applied to an amplifier.

REFERENCE SIGNS LIST

1 Pre-amplifier
2 Post-amplifier
3 Amplitude detector
4, 4a Comparator
5 AOC circuit
10 Tail current source
A30, A40, A50 Operational amplifier
Q10 to Q18, Q20 to Q23, Q30 to Q33, Q50, Q51, Q100 to Q103 Transistor
R10 to R14, R20 to R24, R30 to R37, R40, R50 to R52 Resistor
C30, C40, C05 Capacitor
IS10, IS11, IS20, IS21 Current source

The invention claimed is:

1. A linear amplifier comprising:
 a pre-amplifier configured to amplify an input electrical signal;
 a post-amplifier configured to amplify an output signal of the pre-amplifier;
 an amplitude detector configured to detect an amplitude of an output signal of the post-amplifier and output a voltage corresponding to the amplitude; and
 a comparator configured to control a tail current source of the pre-amplifier such that:
  when the voltage output by the amplitude detector is less than or equal to a reference voltage, a tail current of the pre-amplifier is set to a constant value; and
  when the voltage output by the amplitude detector is larger than the reference voltage, the tail current is reduced to make the voltage output by the amplitude detector equal to the reference voltage.

2. The linear amplifier according to claim 1, wherein the tail current source of the pre-amplifier includes:
 a first transistor which is emitter grounded or source grounded, wherein a collector terminal or a drain terminal of the first transistor is connected to an amplification transistor of the pre-amplifier; and
 a second transistor having a gate terminal connected to an output terminal of the comparator, wherein a constant bias voltage is input to one of a drain terminal and a source terminal of the second transistor and another of the drain terminal and the source terminal of the second transistor is connected to a base terminal or a gate terminal of the first transistor.

3. The linear amplifier according to claim 1, wherein the tail current source of the pre-amplifier includes:
 a first transistor, wherein a constant bias voltage is input to a base terminal or a gate terminal of the first transistor, and a collector terminal or a drain terminal of the first transistor is connected to an amplification transistor of the pre-amplifier; and
 a second transistor having a gate terminal connected to an output terminal of the comparator, wherein one of a drain terminal and a source terminal of the second transistor is connected to an emitter terminal or a source terminal of the first transistor and another of the drain terminal and the source terminal of the second transistor is grounded.

4. The linear amplifier according to claim 1, wherein the comparator includes an operational amplifier including an inverting input terminal to which the voltage output by the amplitude detector is input, and a non-inverting input terminal to which the reference voltage is input.

5. The linear amplifier according to claim 1, wherein the comparator includes:
 an operational amplifier including a non-inverting input terminal to which the reference voltage is input;
 a resistor including a first end connected to an output terminal of the amplitude detector and a second end connected to an inverting input terminal of the operational amplifier; and
 a capacitor including a first end connected to the inverting input terminal of the operational amplifier and a second end connected to an output terminal of the operational amplifier.

6. The linear amplifier according to claim 1, wherein the post-amplifier is a cascode type differential amplifier.

7. The linear amplifier according to claim 1, wherein the pre-amplifier includes:
an amplification transistor having a differential configuration in which a differential signal is input to a base terminal or a gate terminal, and an amplified differential signal is output from a collector terminal or a drain terminal, wherein the tail current source is configured to supply a current to the amplification transistor having the differential configuration; and
two load resistors between a power supply voltage and the collector terminal or the drain terminal of the amplification transistor having the differential configuration.

8. The linear amplifier according to claim 7, further comprising an automatic offset voltage control circuit configured to draw a current from each load resistor of the pre-amplifier such that a DC voltage operating point of an output of the pre-amplifier is constant.

9. A method for providing a linear amplifier, the method comprising:
providing a pre-amplifier for amplifying an input electrical signal;
providing a post-amplifier for amplifying an output signal of the pre-amplifier;
providing an amplitude detector for detecting an amplitude of an output signal of the post-amplifier and outputting a voltage corresponding to the amplitude; and
providing a comparator for controlling a tail current source of the pre-amplifier such that:
when the voltage output by the amplitude detector is less than or equal to a reference voltage, a tail current of the pre-amplifier is set to a constant value; and
when the voltage output by the amplitude detector is larger than the reference voltage, the tail current is reduced to make the voltage output by the amplitude detector equal to the reference voltage.

10. The method according to claim 9, wherein the tail current source of the pre-amplifier includes:
a first transistor which is emitter grounded or source grounded, wherein a collector terminal or a drain terminal of the first transistor is connected to an amplification transistor of the pre-amplifier; and
a second transistor having a gate terminal connected to an output terminal of the comparator, a constant bias voltage being input to one of a drain terminal and a source terminal of the second transistor, and another of the drain terminal and the source terminal of the second transistor being connected to a base terminal or a gate terminal of the first transistor.

11. The method according to claim 9, wherein the tail current source of the pre-amplifier includes:
a first transistor, wherein a constant bias voltage is input to a base terminal or a gate terminal of the first transistor, and a collector terminal or a drain terminal of the first transistor is connected to an amplification transistor of the pre-amplifier; and
a second transistor having a gate terminal connected to an output terminal of the comparator, wherein one of a drain terminal and a source terminal of the second transistor is connected to an emitter terminal or a source terminal of the first transistor and another of the drain terminal and the source terminal of the second transistor is grounded.

12. The method according to claim 9, wherein the comparator includes an operational amplifier including an inverting input terminal to which the voltage output by the amplitude detector is input, and a non-inverting input terminal to which the reference voltage is input.

13. The method according to claim 9, wherein the comparator includes:
an operational amplifier including a non-inverting input terminal to which the reference voltage is input;
a resistor including a first end connected to an output terminal of the amplitude detector and a second end connected to an inverting input terminal of the operational amplifier; and
a capacitor including a first end connected to the inverting input terminal of the operational amplifier and a second end connected to an output terminal of the operational amplifier.

14. The method according to claim 9, wherein the post-amplifier is a cascode type differential amplifier.

15. The method according to claim 9, wherein the pre-amplifier includes:
an amplification transistor having a differential configuration in which a differential signal is input to a base terminal or a gate terminal, and an amplified differential signal is output from a collector terminal or a drain terminal, wherein the tail current source supplies a current to the amplification transistor having the differential configuration; and
two load resistors between a power supply voltage and the collector terminal or the drain terminal of the amplification transistor having the differential configuration.

16. The method according to claim 15, further comprising providing an automatic offset voltage control circuit for drawing a current from each load resistor of the pre-amplifier such that a DC voltage operating point of an output of the pre-amplifier is constant.

17. A method of operating a linear amplifier, the method comprising:
amplifying, by a pre-amplifier, an input electrical signal;
amplifying, by a post-amplifier, an output signal of the pre-amplifier;
detecting, by an amplitude detector, an amplitude of an output signal of the post-amplifier and outputting a voltage corresponding to the amplitude; and
controlling, by a comparator, a tail current source of the pre-amplifier such that when the voltage output by the amplitude detector is less than or equal to a reference voltage, a tail current of the pre-amplifier is set to a constant value, and when the voltage output by the amplitude detector is larger than the reference voltage, the tail current is reduced to make the voltage output by the amplitude detector equal to the reference voltage.

* * * * *